United States Patent [19]

Wise et al.

[11] Patent Number: 4,920,286

[45] Date of Patent: Apr. 24, 1990

[54] METHOD AND CIRCUITRY FOR COMPENSATING FOR NEGATIVE INTERNAL GROUND VOLTAGE GLITCHES

[75] Inventors: Janet L. Wise; Steven E. Marum, both of Sherman, Tex.

[73] Assignee: Texas Instruments Incorporated, Dallas, Tex.

[21] Appl. No.: 881,146

[22] Filed: Jul. 2, 1986

[51] Int. Cl.[5] .................. H03K 19/003; H03K 19/088; H03K 17/16; H03K 17/60

[52] U.S. Cl. ..................................... 307/542; 307/456; 307/443; 307/549

[58] Field of Search ................ 307/440, 443, 446, 456, 307/457, 458, 254, 255, 542, 547, 549

[56] References Cited

U.S. PATENT DOCUMENTS

| | | | |
|---|---|---|---|
| 3,999,080 | 12/1976 | Weathersby Jr. et al. | 307/456 |
| 4,321,490 | 3/1982 | Bechdolt | 307/456 |
| 4,330,723 | 5/1982 | Griffith | 307/443 XR |
| 4,581,550 | 4/1986 | Ferris et al. | 307/443 XR |
| 4,593,210 | 6/1986 | Boyer | 307/443 |
| 4,644,194 | 2/1987 | Birrittella et al. | 307/443 XR |

Primary Examiner—Andrew J. James
Assistant Examiner—David R. Bertelson
Attorney, Agent, or Firm—Carlton H. Hoel; Thomas W. DeMond; Melvin Sharp

[57] ABSTRACT

The specification discloses circuitry for compensating integrated circuits for negative internal ground voltage glitches. An output transistor (30) receives input signals at its base and has an emitter connected through a Schottky diode (32) to internal circuit ground. The compensation circuit includes a transistor (42) coupled to the base of transistor (30) and having an emitter also coupled to internal circuit ground. A capacitor (44) is connected between the base of transistor (42) and a source of bias voltage. Transistor (42) is rendered conductive by the occurrence of negative voltage glitches on the circuit ground, thus reducing voltage on the base of transistor (30) to prevent premature conduction by transistor (30).

9 Claims, 2 Drawing Sheets

METHOD AND CIRCUITRY FOR COMPENSATING FOR NEGATIVE INTERNAL GROUND VOLTAGE GLITCHES

TECHNICAL FIELD OF THE INVENTION

This invention relates to electronic circuits and more particularly relates to methods and circuitry for preventing undesirable output voltage fluctuations in integrated circuitry.

BACKGROUND OF THE INVENTION

Integrated circuits associated with multiple output devices often have undesirable output signal fluctuations which are caused by negative ground voltage variations, commonly termed glitches. Many multiple output devices are rapidly switched, which causes excess current to be dumped into the internal ground of the circuitry. The internal ground nodes of such circuits are connected to an external ground node through a package pin which includes an inherent inductance. The external ground is fixed to zero volts. The excess current dumped into the internal ground and the external ground causes both positive and negative internal ground voltage fluctuations as described by the inductor-voltage equation $V = L\, di/dt$.

In particular, the negative ground voltage fluctuations, often termed spikes or glitches, cause transistors in the integrated circuitry to prematurely turn on when the transistors' emitters are referenced to internal ground and their bases are referenced to the external voltage supply. When such transistors prematurely turn on, the output of the circuitry often begins to oscillate and creates undesirable output signal fluctuations. Such internal ground voltage fluctuations will become increasingly worse as circuit designers strive to obtain faster switching of multiple output devices.

A need has thus arisen for compensation circuitry which can prevent or eliminate undesirable output signal fluctuations caused by internal ground voltage glitches. In particular, a need has arisen for controlling the effects caused by severe negative internal ground voltage fluctuations created by rapid switching of multiple output devices. Such compensation circuitry should be useful with both transistor and diode input devices, and should be controllable as to the level of compensation control.

SUMMARY OF THE INVENTION

In accordance with the present invention, compensation circuitry is provided which substantially reduces or eliminates the shortcomings associated with prior art circuits having negative voltage glitches which cause undesirable output signal fluctuations.

In accordance with the present invention, circuitry is provided to compensate for internal ground voltage glitches which may affect an output transistor having a base for receiving input signals, a collector for generating output signals and an emitter coupled to internal ground. Compensation circuitry is connected to the transistor base for supplying current which pulls down the voltage across the base of the transistor in response to voltage variances occurring on the internal ground. The transistor is thus maintained in a nonconductive mode in the presence of internal ground voltages to prevent undesirable output signal fluctuations.

In accordance with another aspect to the invention, circuitry is provided to compensate for negative voltage glitches appearing on internal ground. The circuitry is used with an output transistor having a base for receiving input signals, a collector for generating output signals, and an emitter coupled to internal ground. A compensation transistor is coupled to the base of the output transistor. The compensation transistor is rendered conductive by the occurrence of negative voltage glitches on internal ground. Conduction of the compensation transistor pulls down the voltage on the base of the output transistor to maintain the output transistor in a nonconductive mode in the presence of negative voltage glitches on internal ground.

In another aspect of the present invention, a method of compensating for negative voltage glitches appearing on internal ground includes applying input signals to the base of a transistor coupled to internal ground. The voltage applied to the base is then reduced in response to the occurrence of negative voltage glitches on internal ground. The transistor is thus maintained nonconductive in the presence of negative voltage glitches, preventing the generation of undesirable output voltage fluctuations.

BRIEF DESCRIPTION OF THE DRAWINGS

Further features and advantages of the present invention will become apparent from the description of the following embodiment, taken in conjunction with the accompanying drawings, in which.

DETAILED DESCRIPTION OF THE INVENTION

Figure 1:
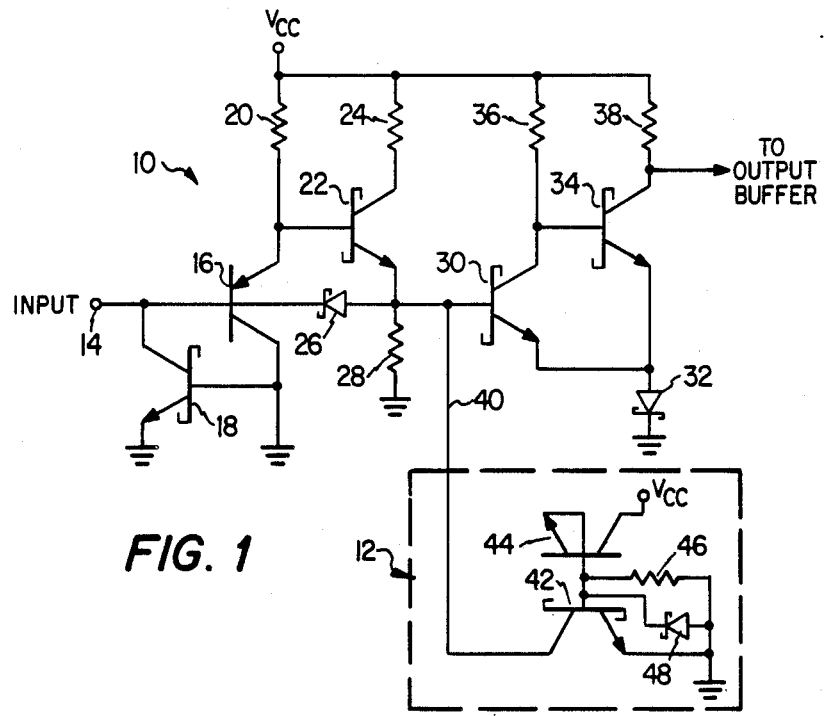
FIG. 1 is a schematic diagram of a preferred embodiment of the invention.

FIG. 1 illustrates a typical TTL input circuit 10 which is subject to problems caused by internal ground voltage fluctuations. The negative glitch compensation circuitry of the invention is enclosed within the dotted line 12. As will be subsequently described, the present negative glitch compensation circuitry 12 eliminates the deleterious effects of internal ground voltage fluctuations of the circuit 10. While the circuit 10 will be specifically described to illustrate the operation of the present negative glitch compensation circuitry 12, it will be understood that the present invention may be utilized with a large number of circuits of various types which have an input referenced to a fluctuating ground voltage.

Input signals are applied to circuit 10 through an input terminal 14 connected to the base of a PNP transistor 16. A NPN bipolar transistor 18 having a Schottky-clamped base-collector junction is connected at its collector to input 14. The base of transistor 18 is connected to the collector of transistor 16. The emitter of transistor 16 is connected to a resistor 20 having a terminal connected to receive Vcc. The emitter of transistor 16 is also connected to a transistor 22 having a Schottky-clamped base-collector junction. The collector of transistor 22 is connected to a resistor 24 having a terminal connected to Vcc. A Schottky diode 26 is connected at its cathode to the base of transistor 16 and at its anode to the emitter of transistor 22. A resistor 28 is connected from the emitter of transistor 22 to internal circuit ground. Likewise, the emitter of transistor 18 and the collector of transistor 16 are connected to internal circuit ground.

TTL input circuits such as shown in FIG. 10 are often used in integrated circuits to rapidly switch multiple output devices. The internal ground of the circuits is connected to an external ground node through conventional package pins, not shown.

The transistor 18 operates as an electrostatic discharge clamp to prevent spurious voltage from entering the circuit. Transistors 16 and 22, in combination with diode 26, form an input buffer stage for driving the base of a transistor 30 having a Schottky-clamped base-collector junction and connected at its emitter to the anode of a Schottky diode 32. The cathode of diode 32 is connected to internal ground. The collector of transistor 30 is connected to another transistor 34 also having a Schottky-clamped base-collector junction.

The collector of transistor 30 is connected to resistor 36 having a terminal connected to Vcc. The collector of transistor 34 is connected to a resistor 38 having a terminal connected to Vcc. The collector of transistor 34 is connected to the remainder of the integrated circuit, such as an output buffer. The output of transistor 30 is driven by the input buffer stage and operates with diode 32 to set the input threshold of the circuit. Diode 26 operates as a speed-up diode for the circuit. Transistor 34 operates as a phase splitter and is driven by output transistor 30 to provide the desired output voltage.

As previously noted, the internal ground of the circuit 10 is connected to an external package pin. This package pin contains an inherent inductance. The external ground is fixed to zero voltage, but the inductance of the package pin causes large positive and negative internal ground voltage fluctuations to be created when large currents are applied to the circuit, as described by the inductor-voltage equation $V = L \, di/dt$. In particular, the negative ground voltage spikes or glitches can operate to cause transistor 30 to prematurely turn on, as its emitter is referenced to internal ground and its base is referenced to the external voltage supply. As will be subsequently described, such premature turn on of transistor 30 causes serious voltage fluctuations in the output signal generated by the circuit 10.

The negative glitch compensator circuitry 12 of the invention operates to prevent transistor 30 from prematurely turning on. Circuit 12 is coupled to the base of transistor 30 by lead 40 which is connected to the collector of a Schottky-clamped transistor 42. The emitter of transistor 42 is connected to internal circuit ground and the base thereof is connected to the base of a transistor 44. The base and emitter of transistor 44 are shorted together such that the transistor operates as a capacitor. The collector of transistor 44 is connected to Vcc. The base of transistor 42 is connected to a resistor 46 which has a terminal connected to the emitter of transistor 42 and internal ground.

A diode 48 is connected at its cathode to the base of transistor 42 and at its anode to circuit ground. Diode 48 aids in the activation of transistor 42. Since circuit ground normally transitions or glitches positive before going negative, diode 48 holds up the voltage of the base of transistor 42 during the positive glitch cycle. Thus, circuit ground does not have to fall a substantial amount in order to turn on transistor 42.

In addition, in certain applications, a resistor (not shown) may be inserted between the base of transistor 30 and the collector of transistor 42 to limit the amount of current that is pulled from the base of transistor 30.

In operation of the negative glitch compensation circuitry 12 of the invention, assume that the voltage drop across the forward biased Schottky diode is 0.65 volts, and the base-emitter, collector-emitter voltages of the transistors of the circuit operating in their active regions to be 0.8 volts and 0.25 volts, respectively. When a logic "0" having a level of 0.5 volts is applied to the input terminal 14, the transistor 16 is turned on, forcing the base of transistor 30 to 0.5 volts $+V_{BE}, Q_{1}$-6(on)$-V_{BE}, Q_{22}$(on)=0.5 volts. This is a low enough potential to cause the transistor 30 to remain non-conductive. In order that transistor 30 may become conductive, the potential at the base of transistor 30 must be $V_{BE}$, $Q_{30}$(on)$+V_{D32}$(on)=1.45 volts. However, if the voltage on the internal ground suddenly transitions or glitches to $-1.0$ volts, as an example, the emitter node of transistor 30 would drop accordingly to $-1.0$ volts $+V_{D32}$(on)$=-0.35$ volts. The base-to-emitter voltage of transistor 30 then becomes 0.5 volts$-(-0.35)$ volts$=0.85$ volts, which causes transistor 30 to turn on and produce undesirable output voltage fluctuations at the collector of transistor 34.

With the addition of the negative glitch compensation circuitry 12, the effects of the internal ground voltage movement is counter balanced. When the internal ground voltage switches negative as described, current is supplied to the base of transistor 42 via the base-emitter shorted capacitor 44. This current is described by the capacitor current equation $I = C \, dv/dt$. Consequently, transistor 42 is supplied with base current and is turned on during the negative voltage glitches of the internal ground. Conduction of transistor 42 pulls down the base of transistor 30 to a $V_{CE}$(on) of 0.25 volts, concurrent with the emitter of transistor 30 being pulled low. Consequently, the base-emitter junction of transistor 30 never attains the required potential of 0.8 volts to turn on. The level of operation of the negative glitch compensation circuitry 12 may be tuned by adjustment of the size of transistor 44 to adjust the capacitance of the circuit. The negative glitch compensation circuitry 12 of the invention thus follows the negative voltage variations on internal ground to maintain the output transistor in a nonconductive state to prevent the undesirable output voltage variations. A slight amount of additional chip area is required for the base-emitter shorted capacitor 44, but the addition of the present negative glitch compensation circuitry 12 has been found to only minutely increase the chip area normally required for the circuit 10.

Figure 2:
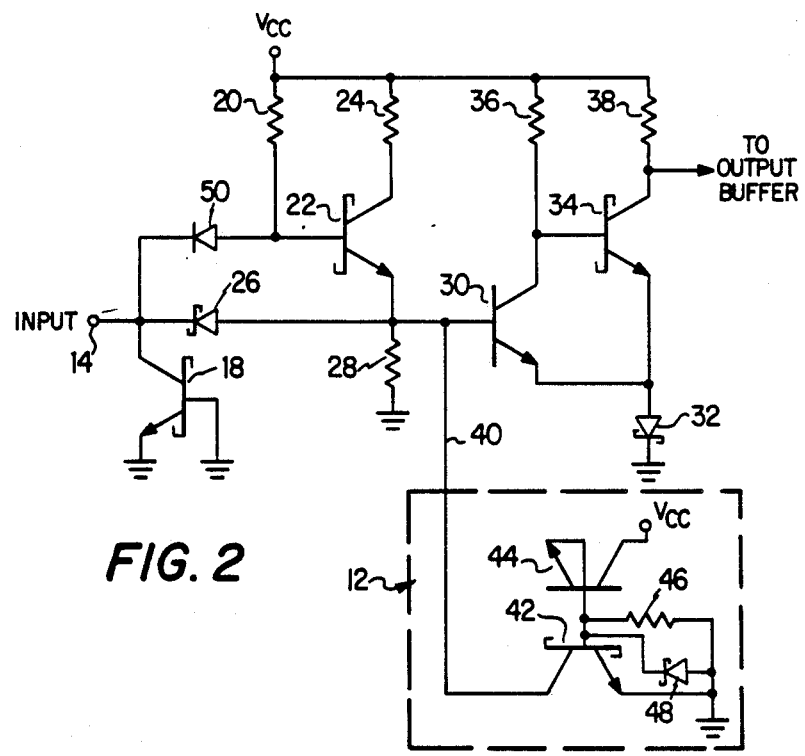
FIG. 2 is a schematic diagram of an alternate embodiment of the present invention.

Refer now to FIG. 2, wherein like numbers refer to like and corresponding parts of FIG. 1. FIG. 2 illustrates that the negative glitch compensator circuitry 12 of the present invention is useful on input circuits with diode inputs as well as transistor inputs. The circuitry shown in FIG. 2 is essentially identical to that shown in FIG. 1, with the exception that diode 50 takes the place of transistor 16. In this circuit, the cathode of diode 50 is connected to the input node 14 and the anode is connected to the resistor 20. The speed-up diode 26 is connected to the input node 14 and is connected as in the prior circuit at its anode to the emitter of transistor 22. The transistor 18 is connected at its collector to the cathode of diode 50 and is connected at its base to internal ground. The remainder of the circuitry shown in FIG. 2 is identical to that previously described with respect to FIG. 1 and will not be subsequently redescribed.

The operation of the input circuitry of FIG. 2 remains essentially the same as that of FIG. 1, with the diode 50 replacing the base-emitter junction of the transistor 16. The circuitry of FIG. 2 may operate with somewhat higher input current than the circuitry of FIG. 1. Otherwise, the circuitry of FIG. 2 has the same inherent problems with voltage fluctuations internal ground as that previously described. As before, the negative glitch compensation circuitry 12 shown in FIG. 2 pulls down the base of transistor 30 during internal negative ground glitches to prevent premature turn on. An advantage of the present negative glitch compensation circuitry 12 is that it may be used on diode input circuits as well as transistor input circuits shown in FIG. 1, as circuitry 12 operates independent of voltage deviations at the input of the device.

Figure 3:
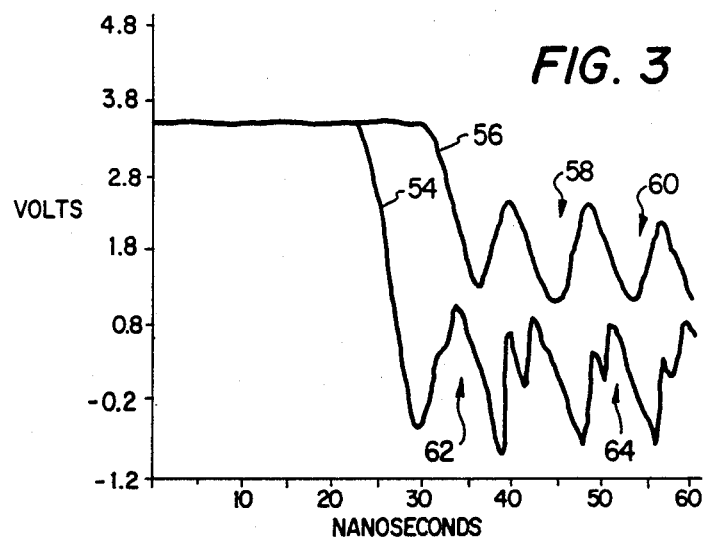
FIG. 3 is a graph illustrating a state test of a multi-output circuit without the glitch compensation circuitry of the present invention.
Figure 4:
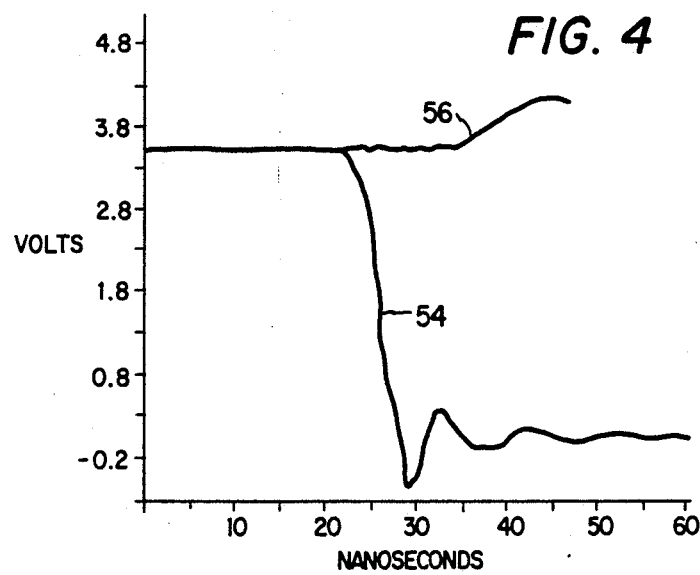
FIG. 4 is a graph of a state test of a multi-output circuit which includes the glitch compensation circuitry of the present invention.

FIGS. 3 and 4 illustrate the advantages provided by the present negative glitch compensator circuitry 12. FIG. 3 illustrates a graph of the outputs of two identical circuits as shown in FIG. 1, but without compensator circuitry 12. Graph line 54 illustrates the low output voltage of a first TTL input circuit, while graph 56 illustrates the high output voltage of a second TTL circuit in accordance with FIG. 1. The output voltage signals are plotted as voltage versus nanoseconds. When the circuits are subjected to a high temperature, high beta 3-state test, it may be seen that the output graph line 54 moves from a 3-state to a logic "0"state. Similarly, the graph line 56 of the second circuit moves toward a logic "1" operation which is particularly susceptible to negative voltage spikes or glitches. It may be seen that because of such negative glitches on internal ground, the waveform 56 goes into undesirable oscillations generally indicated by the arrows 58 and 60. In addition, the waveform 54 includes undesirable oscillations 62 and 64. As noted, these undesirable operations are caused by the output transistors being prematurely turned on due to the negative voltage glitches.

FIG. 4 illustrates a graph of the identical circuits previously described, but with the addition of the negative glitch compensation circuitry 12 coupled to the bases of the output transistors 30. It may be see that the waveforms 54 and 56 operate quite normally when transistioning to "0" and "1" states, without the undesirable oscillations noted in FIG. 3. Tests thus indicate that the present negative glitch compensation circuitry 12 is clearly advantageous in preventing such undesirable voltage oscillations.

It should be understood that the resent invention is not limited to TTL input devices or even to bipolar transistors. The present invention may be used on a wide variety of circuits which have an internal trip point or input reference to ground which is subject to undesirable voltage fluctuations. For example, the invention may be used with NMOS or CMOS input circuits.

The present invention is particularly useful with input circuits used on multiple output devices wherein rapid switching causes substantial excess current to be dumped into the internal ground of the device due to the inductance of the external package pins, as previously noted.

Having described the invention in connection with certain specific embodiments thereof, it is to be understood that further modifications may now suggest themselves to those skilled in the art and it is intended to cover such modifications as fall within the scope of the appended claims.

What is claimed is:

1. Circuitry for compensating for internal ground voltage fluctuations comprising:
   an output transistor having a base for receiving input signals, said output transistor also including a first electrode for generating output signals and a second electrode coupled to internal ground;
   a compensation transistor coupled at its collector to said base of said output transistor and at its emitter to internal ground; and
   a supply transistor having a collector connected to receive supply voltage and a shorted emitter-base connected to said base of said compensation transistor for supplying current to the base of said compensation transistor, said compensation transistor being rendered conductive by the occurrence of negative voltage fluctuations on internal ground.

2. The circuitry of claim 1 wherein said supply transistor has a predetermined capacitance which controls the amount of current supplied to the base of said compensation transistor.

3. Circuitry for compensating for negative voltage fluctuations appearing on internal ground comprising:
   an output transistor having a control electrode for receiving input signals, a second electrode for generating output signals, and a third electrode coupled to internal ground;
   a compensation transistor having a control terminal, a first terminal coupled to said control electrode of said output transistor, and a second terminal coupled to internal ground; and
   a supply transistor having one terminal connected to receive supply voltage and shorted second and third terminals connected to said control terminal for providing a source of current to the control terminal of said compensation transistor, said compensation transistor being rendered conductive by the occurrence of negative voltage fluctuations on internal ground.

4. The circuitry of claim 3, wherein said compensation transistor is a bipolar transistor, said control terminal, said first terminal and said second terminal being a base, collector and emitter respectively.

5. The circuitry of claim 4 wherein said supply transistor has a predetermined capacitance which controls the amount of current supplied to the base of said compensation transistor and further comprising a diode connected between said supply transistor and internal ground.

6. Circuitry for compensating for internal ground voltage fluctuations comprising:
   an output transistor having a base for receiving input signals, said output transistor also including a first electrode for generating output signals and a second electrode coupled to internal ground;
   a compensation transistor coupled at its collector to said base of said output transistor and at its emitter to internal ground;
   a diode coupled between a control electrode of said compensation transistor and internal ground to thereby maintain a voltage on said control electrode during positive excursions in the voltage on said internal ground; and
   a supply transistor having a collector connected to receive supply voltage and a shorted emitter-base connected to said control electrode of said compensation transistor, said supply transistor having a predetermined capacitance which controls the amount of current supplied to said control electrode and renders said compensation transistor conductive by the occurrence of negative voltage fluctuations on internal ground.

7. In a circuit wherein an output transistor has an input for receiving input signals and an electrode coupled to circuit ground, the improvement comprising:

a compensation transistor coupled between an input electrode of the output transistor and to circuit ground;

a capacitor coupled between a control terminal of said compensation transistor and a source of supply voltage for providing current to said control terminal;

a diode coupled between a control electrode of said compensation transistor and circuit ground to provide a voltage to said control electrode during positive excursions in the voltage level on circuit ground; and said compensation transistor being rendered conductive by the occurrence of negative fluctuations on circuit ground to thereby reduce the voltage on said input electrode and prevent premature conduction of the output transistor.

8. A circuit for eliminating the effects of negative transients on an internal reference node in an integrated circuit comprising:

an output transistor having a base electrode for receiving an input signal, a collector electrode for providing an output signal, and an emitter electrode coupled to said internal reference node;

a compensation transistor having a base terminal, a collector terminal coupled to said base electrode, and an emitter terminal coupled to said internal reference node for reducing the voltage on said base electrode during negative transitions in the voltage level on said internal reference node;

a capacitor coupled between said base terminal and a source of supply voltage for providing base current to said base terminal; and a diode coupled at its cathode to said base terminal and coupled at its anode to said internal reference node for maintaining a positive voltage on the base of said compensation transistor during positive transitions in the voltage on said internal reference node and thereby reduce the magnitude of said negative transient required to activate said compensation transistor.

9. A circuit as recited in claim 8, wherein said capacitor comprises a transistor having a base, collector and emitter, said base being connected to said emitter and forming one terminal of said capacitor, said collector forming a second terminal of said capacitor.

* * * * *